United States Patent [19]

Winter et al.

[11] Patent Number: 4,736,882
[45] Date of Patent: Apr. 12, 1988

[54] THERMODE DESIGN FOR TAB AND METHOD OF USE

[75] Inventors: Joseph Winter, New Haven; Julius C. Fister, Hamden, both of Conn.

[73] Assignee: Olin Corporation, New Haven, Conn.

[21] Appl. No.: 888,173

[22] Filed: Jul. 22, 1986

[51] Int. Cl.[4] .......................................... H01L 21/603
[52] U.S. Cl. .................... 228/180.2; 228/44.7
[58] Field of Search .............. 228/180.2, 44.7, 6.2; 357/70

[56] References Cited

U.S. PATENT DOCUMENTS

| | | | |
|---|---|---|---|
| 3,480,836 | 11/1969 | Aronstein | 228/180.2 X |
| 3,519,890 | 7/1970 | Ashby | 317/101 |
| 3,689,991 | 9/1972 | Aird | 357/70 X |
| 3,698,074 | 10/1972 | Helda et al. | 357/70 X |
| 3,765,590 | 10/1973 | Duffek et al. | 228/180.2 X |
| 3,902,148 | 8/1975 | Drees et al. | 357/70 |
| 4,109,096 | 8/1978 | Dehaine | 174/68.5 |
| 4,234,666 | 11/1980 | Gursky | 428/573 |
| 4,331,740 | 5/1982 | Burns | 428/572 |

Primary Examiner—Kenneth J. Ramsey
Attorney, Agent, or Firm—Gregory S. Rosenblatt; Paul Weinstein

[57] ABSTRACT

An improved thermode for bonding interconnect tape to at least one bonding site on an electronic device is disclosed. The thermode includes a component for controlling deflection of the interconnect tape at a position outside of said bonding site whereby thermal stresses generated in the interconnect tape while bonding are substantially reduced.

15 Claims, 2 Drawing Sheets

THERMODE DESIGN FOR TAB AND METHOD OF USE

While the invention is subject to a wide range of applications, it is particularly useful for improved tape automated bonding to semiconductor devices. In particular, an improved thermode incorporates a provision for introducing a controlled amount of lead deflection to accomodate thermally generated stress in the tape leads.

This application is related to U.S. patent application Ser. No. 824,894 entitled "Improved Interconnect Tape Automated Bonding" by Jackie A. Walter.

This invention relates to an improved thermode for bonding an interconnect tape to a semiconductor device in a tape automated bonding (hereinafter referred to as TAB) process. A general review of TAB technology is set forth in an article entitled "TAB Technology Tackles High Density Interconnections" by Tom Dixon, which appeared in the December, 1984, volume of *Electronic Packaging & Production* at pgs. 34–39. TAB technology comprises an interconnect technology used to interconnect a semiconductor device to a leadframe, semiconductor package contacts or a printed circuit board. In most cases, TAB is used instead of conventional wire bonding technology. TAB is finding increased use commercially because of the trend towards increased circuit density. TAB permits closer spacing of interconnect bonding pads on the semiconductor die than would be achievable by wire bonding.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect tape generally comprises a plurality of narrow leads arranged to extend outwardly from a semiconductor die such that the inner lead portions are adapted to be bonded to the semiconductor die contact pads and the outer lead portions are adapted to be bonded to a leadframe, circuit board, etc., as desired. In the single layer version, a metal frame supports the elongated leads; whereas, in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired leadframe, package circuitry or printed circuitry, as desired. The TAB leads are formed from a metal foil such as copper foil and are relatively thin, namely one-half to six mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermocompression bond between the inner lead portion of the TAB leads and the chip. Bumped tapes eliminate the need for bumping of the wafer and, therefore, permit the TAB interlead bond portions to be bonded directly to ordinary semiconductor die bonding pads. The bumped tape normally has a copper projection or bump positioned at the point where it is to be joined to the die. This bump may, if desired, be covered with a suitable plating such as gold, tin or nickel.

During inner lead bonding, problems arise utilizing TAB technology due to the difference in coefficient of thermal expansion of the TAB interconnect tape as compared to the electronic device or semiconductor chip to which the inner leads are bonded. At the time of inner lead bonding, the interconnect leads remain attached to the TAB carrier. Therefore, this difference in coefficient of thermal expansion causes stresses to build up in the leads, which can cause poor inner lead bonding in the first instance or breaking of bonds during further handling. Further, particularly with single layer metal tapes, the good thermal conductivity of the TAB interconnect carrier and leads result in heat required for inner lead bonding being dissipated by conduction through the leads and the interconnect tape support structure. Both of these problems can seriously impact the viability of TAB technology since it is essential that the technology provide reliable inner lead bonds. This is especially the case since TAB technology finds its most beneficial application with respect to high lead count semiconductor devices, which are relatively expensive. Losses due to failed inner lead bonds with such expensive devices are clearly undesirable and not acceptable.

The stress build up problem in the interconnect leads has been recognized and a number of approaches for reducing the problem have been tried as exemplified in U.S. Pat. Nos. 3,519,890 to Ashby, 3,902,148 to Drees et al., 4, 109,096 to Dehaine and 4,234,666 to Gursky. The approaches outlined in these patents involve providing the interconnect leads with yieldable portions which yield under the aforenoted stresses to reduce them. The approaches set forth in these patents are effective for reducing stresses in the leads during inner lead bonding. However, since the yieldable structures are incorporated in the leads themselves they substantially reduce the opportunity for providing interconnect tapes having very high lead counts. When the interconnect tape includes very high lead counts on the order of 100 leads or more, it is not desirable to utilize the stress reducing approaches of the aforenoted patents. Further, the stress reducing approaches of these patents may not have a substantial effect on the thermal dissipation problem previously described since each of the leads is still directly connected to the tape carrier.

A prior art alternative which has been suggested as a means for reducing the stress and thermal dissipation problems while allowing for high lead counts in the interconnect tape is to employ a ring connected at its corners by tabs to the interconnect tape carrier with the leads extending inwardly from the sides of the ring. The thought was that by connecting the ring to the carrier only at the corners the thermal dissipation would be reduced. Further, the unsupported sides of the ring would be sufficiently yieldable to reduce stresses. Since this approach does not involve the leads themselves, which are only connected to the ring at their bases, high lead counts are possible. It has been found that even this approach is not adequate to fully solve the problems which have been identified. The stress relieving properties provided by the ring structure may not be uniform since the sides of the ring can yield more readily in the middle than at the corners where they are interconnected with the carrier. Therefore, leads toward the corners are not sufficiently stress relieved, which is clearly undesirable. While thermal dissipation is reduced, it is not sufficiently reduced by this approach to overcome the bondability problems associated with thermal dissipation.

U.S. Patent No. 4,331,740 to Burns is cited because it discloses a tab interconnect tape having an inner ring structure from which the interconnect leads inwardly extend. It is not believed that the ring structure disclosed in this patent would be effective for overcoming the stress and thermal dissipation problems discussed hereinbefore. The interconnections between the ring and the carrier do not appear to be sufficiently yieldable to reduce stresses and do not appear to be configured to reduce thermal dissipation during inner lead bonding.

It is an aim of the present invention to provide a thermode for shaping an interconnect tape used in tape automated bonding which avoids the problems and difficulties encountered by the prior art approaches.

It is a further aim of this invention to provide such a thermode to shape an interconnect tape to improve the reliability of inner lead bonding by reducing stresses in the leads and by reducing thermal dissipation during bonding.

It is yet a further aim of this invention to provide a thermode for shaping an interconnect tape as above whereby the bonding process is performed in a more economical manner.

Accordingly, there has been provided an improved thermode for bonding interconnect tape to at least one bonding site on an electronic device is disclosed. The thermode includes a component for controlling deflection of the interconnect tape at a position outside of said bonding site whereby thermal stresses generated in the interconnect tape while bonding are substantially reduced.

BRIEF DESCRIPTION OF THE DRAWINGS

These and other aims and advantages will become more apparent from the following description and drawings.

Referring now to FIG. 1, there is shown an examplary interconnect tape 10 suitable for use with the present invention. In the embodiment of FIG. 1, an all metal tape 10 is shown comprising a single layer tape. It is within the scope of this invention to apply it to multilayer tapes, as will be described hereafter, including the two and three layer varieties.

Figure 1:
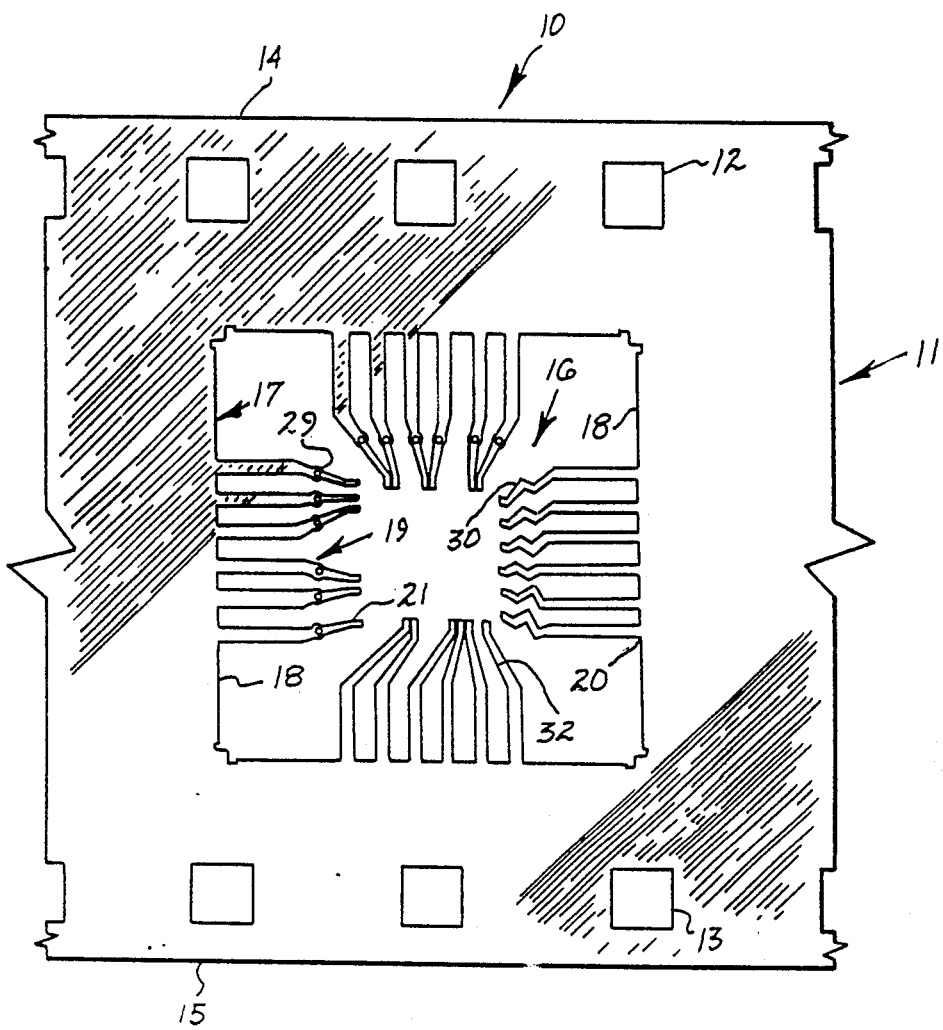
FIG. 1 is a top view of a portion of an interconnect tape in accordance with a preferred embodiment of the present invention.

The tape 10 comprises a metal foil such as copper foil, however, any desired metal could be utilized. The tape 10 comprises a carrier member 11 having two rows of sprocket holes 12 and 13 extending longitudinally adjacent opposing longitudinal edges 14 and 15 of the carrier member 11. The use of such sprocket holes in TAB type tapes is conventional and permits operations on the tape to be properly registered by reference to the sprocket holes. Only one portion or segment of the tape 10 is shown in FIG. 1 carrying a single interconnect lead pattern 16. Each interconnect lead pattern 16 is adapted for connection to an electronic device such as a semiconductor chip. The tape 10 would generally extend for a desired length in a longitudinal sense and contain a plurality of interconnect lead patterns 16 longitudinally spaced apart along its length. For purposes of describing the invention herein, however, only a portion of the tape is shown having a single interconnect lead pattern 16.

A first frame member 17 is comprised of four sides 18 arranged generally in the shape of a square. However, it is within the scope of this invention for the frame member 17 to have any desired number of sides 18 or shape. The frame member 17 supports a plurality of elongated interconnect leads 19 at their outer leads 20. The leads 19 extend inwardly of the frame member 17 in a cantilever fashion. The free ends 21 of leads 19 are adapted to be bonded to bonding pads or bumps of the electronic device as inner lead bonds. The free ends 21 of the leads 19 may be bumped or unbumped as desired for bonding to respective bumped or unbumped contact pads of semiconductor devices.

The leads 19 may include means for reducing residual stresses 29 or 30 as are known in the art arranged within the leads themselves. The interconnect lead pattern 16 shown in FIG. 1 deliberately has been illustrated to exemplify a variety of lead 19 types. Ordinarily, if an inlead means for reducing stresses 29 or 30 were chosen, the desired approach would be uniformly used throughout all the leads 19 of the pattern. The inlead stress relieving means 29 is analogous to that disclosed in the Dehaine and Burns patents noted previously. The inlead stress reducing means 30 is analogous to that disclosed by Drees et al. Any desired lead shape as are known in the TAB art could be employed as well as any desired inlead stress relieving device. The use of an inlead stress relieving means 29 or 30 is optional and it is unlikely that such inlead stress relieving means could be employed in high lead count TAB interconnect tapes 10.

Having thus discussed the structure of the TAB interconnect tape 10 in FIG. 1, further details concerning the benefits obtained through applying the concepts, in accordance with this invention, to such a structure and the various alternatives which might be considered will now be described.

Typically, all of the leads on a TAB tape are bonded concurrently to the bonding pads on an electronic device. It is also within the terms of the present invention to bond the tapes to the leadframe at the same time. The bonding process requires the tape, and possibly the leadframe and electronic device, to be heated to enhance the speed and strength of the bonds. The electronic device, usually a semiconductor device, is usually constructed of a semiconductor material which has a very low coefficient of thermal expansion (CTE) as compared to that of the TAB tape. Therefore, when the tape and semiconductor device begin to cool down to ambient temperature, the mismatch in CTE may subject the tape, which is at least connected at one end to sides 18 of frame member 17, to high thermally induced stress. The latter stresses are generated because the tape is contracting much more rapidly than the semiconductor device. The result is that the bond between the tape and the electronic device may break. The same type of problem may exist between the leadframe and the tape if the materials have a large mismatch in their CTEs'.

The solution to this problem was conventionally handled in the art by forming stress relief structures in the tape prior to the bonding process. These solutions added to the cost of the tape and often reduced the number of bond sites available for a particular tape. The present invention overcomes this problem by forming the stress relief means in the tape at the time the latter is being bonded. In addition, the tape does not contain any unusual structure which may reduce the number of bond sites.

The present invention provides a loop configuration in the tape leads to accomodate the thermal stress. The loop configuration is of sufficient length so that a substantially zero stress condition exists after the tape has cooled to ambient temperature following bonding. Another important advantage of this invention is the prevention of interference with adjacent tape units in the adjacent tape configuration when reel to reel systems are used.

The dimensions of the loop are preferably carefully controlled in order to maintain two dimensional characteristics of the tape after cooling to room temperture. The loop requirements are defined by the following equations:

$$L = L_o(1 + \alpha\Delta T) \quad (1)$$

$$h = \tfrac{1}{2}\sqrt{L^2 - L_o^2} \quad (2)$$

where
  $L_o$ is the initial lead length;
  L is the lead length at the instant of bonding;
  $\Delta T$ is the temperature difference between the ends of the lead at the time of bonding;
  $\alpha$ the coefficient of thermal expansion of the TAB tape; and
  h is the required loop depth or deflection.

Assuming that the tape is made of copper having a CTE of about $160 \times 10^{-7}$, the lead temperature is about 425° C., typical values for h are about 0.006 and 0.012 for lead lengths of about 0.1 and 0.2 inches, respectively.

Figure 2:
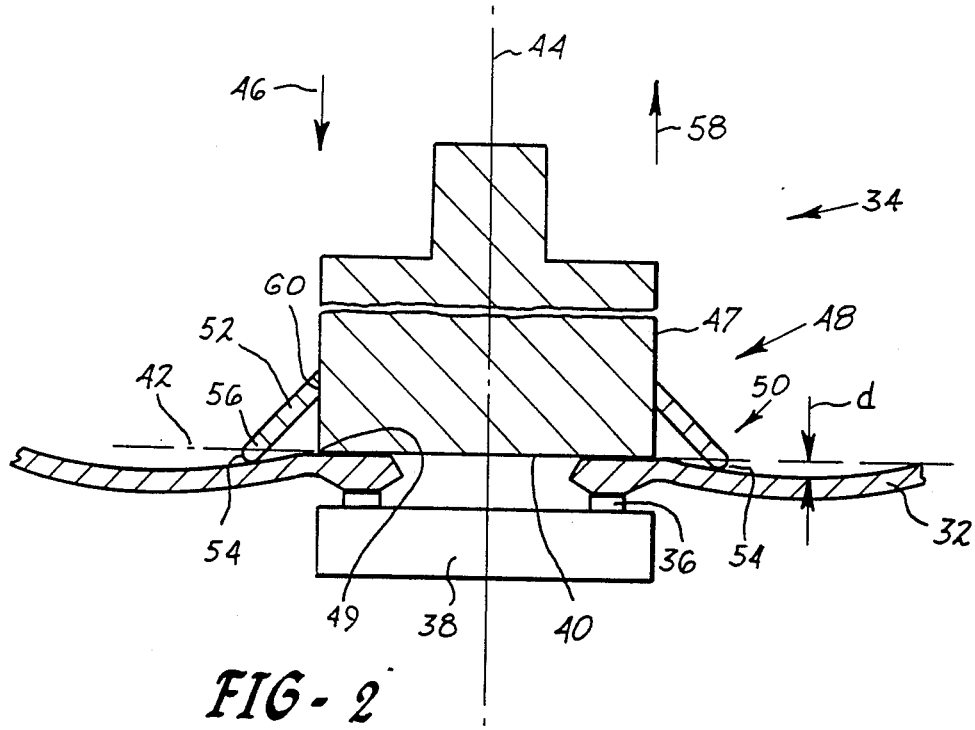
FIG. 2 is a side view of a thermode having a deflection device bonding an interconnect tape to an electronic device in accordance with the present invention.

The present invention is specifically directed to a unique thermode for developing and maintaining a critical deflection in one or more of the interconnect tape leads just prior to the instant of bonding. For example, the interconnect tape leads 32, as illustrated in FIG. 1, may be deflected the required amount d using the thermode design as illustrated in FIG. 2. The improved thermode 34 bonds an interconnect tape 32 to at least one bonding site 36 on an electronic device 38. The thermode component 34 has a heated bonding surface 40 substantially extending in a plane 42. A longitudinal axis 44 extends perpendicular to the plane. The thermode component is reciprocally moveable along the longitudinal axis 44 whereby the heated bonding surface 40 moves in a first direction 46 for bonding the interconnect tape to the at least one bonding site 36 on the electronic device. The thermode component further includes a side wall 47 extending from the edge 49 of the bonding surface in a second direction 58 substantially parallel to the longitudinal axis 44.

Means 48 are adjoined to the thermode component for controlled deflection d of the interconnect tape away from plane 42 of the bonding surface 40 at a position 50 outside the bonding site whereby thermal stresses generated in the interconnect tape while bonding are substantially eliminated. The means 48 adjoined to the thermode 34 include a skirt-like component 52 affixed to the side wall 47 of the thermode component by any conventional means such as welding. The skirt-like component preferably extends substantially around the thermode component and is affixed to the side wall along an inner end portion 60 whereby the skirt-like component moves in conjuction with said thermode component. It is, however within the terms of the present invention, for the skirt-like to extend from the thermode in sections in order that it only contact selected interconnect tape leads as desired.

The skirt-like component 52 has a contact surface 54 at an outer end portion 56 for engaging the tape. The contact surface 54 is spaced from the plane 42 of the bonding surface in the first direction 46 whereby the controlled deflection d can be formed within the the interconnect tape. The contact surface has a curved shape to reduce the contact area with the interconnect tape and reduce the liklihood of scratching the tape.

The process of using the thermode of the present invention is now described. The process of bonding an interconnect tape to at least one bonding site on an electronic device, comprising the following steps. An interconnect tape is positioned between a thermode component and a semiconductor device 38. The thermode component has a heated bonding surface 40 which moves towards and away from the device 38. The heated bonding surface moves in a first direction for bonding the interconnect tape to the at least one bonding site on the electronic device 38. The thermode may be equipped for ultrasonic bonding.

The interconnect tape has a loop formed in its length of a specific deflection, just prior to the bonding of the leads to the device 38, by a contact surface which moves in conjuction with the movement of the thermode. The deflection is of a controlled amount and in a position outside of the bonding site on the interconnect tape. The deflection enables the thermal stresses generated in the interconnect tape from bonding to be substantially eliminated. The skirt-like component preferably has a curved contact surface 54 at an outer end portion for engaging the tape without marring the finish of the tape.

Figure 3:
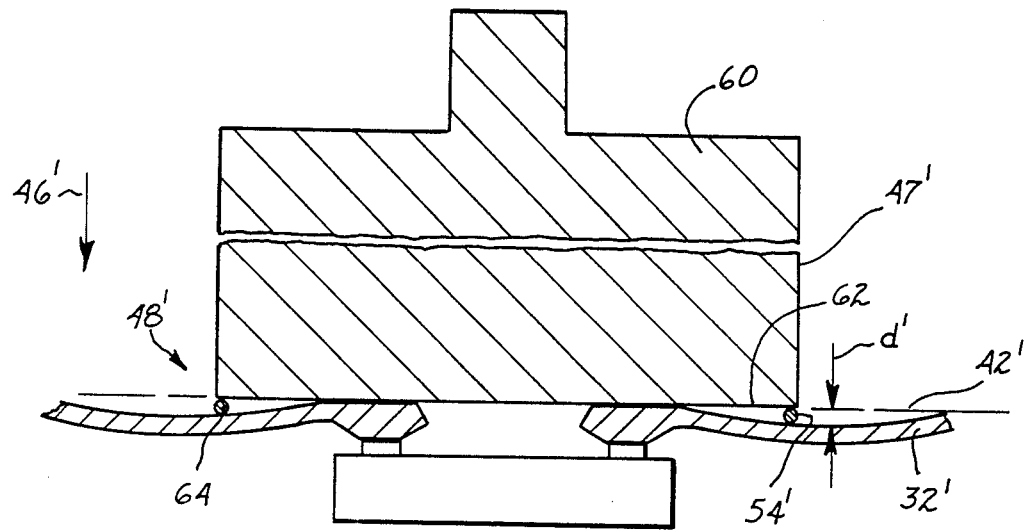
FIG. 3 is a side view of second embodiment of the present invention showing a side view of a thermode having a deflection device bonding an interconnect tape to an electronic device.

A second embodiment of the present invention is illustrated in FIG. 3. The reference numerals which are primed represent substantially components to those indicated by the identical unprimed reference numerals in the embodiment illustrated in FIG. 2. The thermode 60 of the second embodiment is substantially the same as that described with respect to the first embodiment except that the bonding surface 62 extends substantially to or over the point at which contact is made with the lead to form the loop. The means 48' adjoined to the thermode includes a deflection element 64 affixed to the bonding surface 62. The deflection element has a contact surface 54' for engaging the interconnect tape. The contact surface is spaced from the plane 42' of the bonding surface in the first direction 46' whereby controlled deflection d' can be formed within the interconnect tape 32'.

The deflection element 64 further includes the contact surface 54' having a curved shape to reduce the contact area with the tape. As explained hereinbefore, the reduced area is beneficial in that it reduces the exposure of the interconnect tape to marring. The deflection element preferably extends about and is affixed to the outer periphery of the bonding surface. However, it is within the terms of the present invention to adjoin only sections of the deflection element at desired locations on the bonding surface or on the sidewall 47' of the thermode. The deflection element is preferably substantially circular in cross section. The process of using the thermode 60 is substantially the same as the process described with regard to the embodiment illustrated in FIG. 2.

The patents and publication set forth in this specification are intended to be incorporated by reference herein.

It is apparent that there has been provided in accordance with this invention an improved thermode for bonding interconnect tape used in tape automated bonding which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. An improved thermode for bonding an interconnect tape to at least one bonding site on an electronic device, comprising:
    a thermode component having a heated bonding surface substantially extending in a plane;
    said thermode component having a longitudinal axis extending perpendicular to said plane;
    said thermode component being reciprocally moveable along said longitudinal axis whereby said heated bonding surface moves in a first direction for bonding said interconnect tape to said at least one bonding site on said electronic device;
    means adjoined to said thermode component for controlling deflection of said interconnect tape away from said plane of said bonding surface at a position outside said bonding site whereby thermal stresses generated in said interconnect tape while bonding are substantially reduced.

2. The improved thermode of claim 1 wherein said means affixed to said thermode include a skirt-like component affixed to the thermode component, said skirt-like component having a contact surface at an outer end portion for engaging said tape, said contact surface being spaced from the plane of said bonding surface in the first direction whereby said controlled deflection can be formed within said interconnect tape.

3. The improved thermode of claim 2 wherein said thermode component further includes a side wall extending from the edge of said bonding surface in a second direction substantially parallel to the longitudinal axis; and
    said skirt-like component extending substantially around said component and being affixed to said side wall along an inner end portion whereby said skirt-like component moves in conjunction with said thermode component.

4. The improved thermode of claim 3 further including said contact surface having a curved shape to reduce the contact area of the controlling deflection means with said tape.

5. The improved thermode of claim 1 wherein said means adjoined to said thermode include a deflection element affixed to said bonding surface, said deflection element having a contact surface for engaging said interconnect tape, said contact surface being spaced from the plane of said bonding surface in the first direction whereby said controlled deflection can be formed within said interconnect tape.

6. The improved thermode of claim 5 wherein said deflection element further includes said contact surface having a curved shape to reduce the contact area with said interconnect tape.

7. The improved thermode of claim 6 further including said deflection element extending about and being affixed to the outer periphery of said bonding surface.

8. The improved thermode of claim 7 further including said deflection element being substantially circular in cross section.

9. The process of bonding an interconnect tape to at least one bonding site on an electronic device, comprising the steps of:
    providing a thermode component having a heated bonding surface substantially extending in a plane, said thermode component having a longitudinal axis extending perpendicular to said plane;
    reciprocating said thermode component along said longitudinal axis whereby said heated bonding surface moves in a first direction for bonding said interconnect tape to said at least one bonding site on said electronic device;
    controlling deflection of said interconnect tape away from said plane of said bonding surface at a position outside said bonding site during the bonding of said interconnect tape wherein the step of controlling deflection includes the step of adjoining a skirt-like component to the thermode component, said skirt-like component having a contact surface at an outer end portion for engaging said interconnect tape, said contact surface being spaced from the plane of said bonding surface in the first direction whereby said controlled deflection can be formed within said interconnect tape whereby thermal stresses generated in said interconnect tape while bonding are substantially reduced.

10. The process of claim 9 further including the steps of:
    providing said thermode component with a side wall extending from the edge of said bonding surface in a second direction substantially parallel to the longitudinal axis;
    extending said skirt-like component substantially around said component; and
    affixing said skirt-like component to said side wall along an inner end portion whereby said skirt-like component moves in conjuction with said thermode component.

11. The process of claim 10 further including the step of providing said contact surface with a curved shape to reduce the contact area with said tape.

12. The process of claim 10 further including the steps of:
    affixing a deflection element to said bonding surface;
    providing said deflection element with a contact surface for engaging said tape; and
    spacing said contact surface from the plane of said bonding surface in the first direction whereby said controlled deflection can be formed within said interconnect tape.

13. The process of claim 12 further including the step of forming said contact surface on said deflection element with a curved shape to reduce the contact area with said tape.

14. The process of claim 13 further including the step of extending said deflection element about and affixing said deflection element to the outer periphery of said bonding surface.

15. The process of claim 14 including the step of providing said deflection element substantially circular in cross section.

* * * * *